United States Patent [19]
Kusakari

[11] Patent Number: 5,473,565
[45] Date of Patent: Dec. 5, 1995

[54] METHOD OF FLASH WRITING WITH SMALL OPERATION CURRENT AND SEMICONDUCTOR MEMORY CIRCUIT ACCORDING TO THE METHOD

[75] Inventor: Takashi Kusakari, Tokyo, Japan

[73] Assignee: NEC Corporation, Tokyo, Japan

[21] Appl. No.: 300,190

[22] Filed: Sep. 2, 1994

[30] Foreign Application Priority Data

Sep. 14, 1993 [JP] Japan ................................ 5-228392

[51] Int. Cl.⁶ .................................................. G11C 7/00
[52] U.S. Cl. ..................... 365/189.01; 365/218; 365/233
[58] Field of Search ............................... 365/189.01, 194, 365/218, 233, 189.05

[56] References Cited

U.S. PATENT DOCUMENTS 5,003,510  3/1991  Kamisaki ........................... 365/189.01
5,255,243  10/1993  Kitazawa ................................. 365/233

FOREIGN PATENT DOCUMENTS 2-29987  1/1990  Japan .

Primary Examiner—Joseph A. Popek
Attorney, Agent, or Firm—Sughrue, Mion, Zinn, Macpeak & Seas

[57] ABSTRACT

The present invention provides a semiconductor memory circuit which can restrict the increase of an operation current in a flash write mode to a minimum even when there are problems caused in the manufacturing process such as short-circuits in the wiring. A timing control circuit of the semiconductor memory circuit of the present invention comprises an FW latch signal generation circuit and a latch circuit both for detecting that a row address strobe signal, an $\overline{RAS}$ signal and a flash write enable signal inputted have become active, and an FW gate signal generation circuit for activating the FW gate signal for only a limited fixed time determined by a delay circuit when an FW gate activation signal is outputted from the latch circuit which has detected the activation of both signals. With the FW gate signal activated, the flash write gate switch turns active for performing the flash write activity. After the flash write activity is finished, the FW gate signal becomes inactive immediately even when the $\overline{RAS}$ signal is active.

7 Claims, 8 Drawing Sheets

METHOD OF FLASH WRITING WITH SMALL OPERATION CURRENT AND SEMICONDUCTOR MEMORY CIRCUIT ACCORDING TO THE METHOD

BACKGROUND OF THE INVENTION

1. Field of the Invention

The present invention relates to a semiconductor memory circuit, particularly to a semiconductor memory circuit in which data for one word can be written in a corresponding amount of memory cells in one access activity.

2. Description of the Related Art

Hitherto, in semiconductor memory circuits of this type, a flash write gate (hereinafter referred to as an FW gate) has been activated or inactivated in synchronization with a trailing edge or leading edge of a row address strobe (hereinafter referred to as $\overline{RAS}$, where the sign $^-$ shows that signals or terminals are active when they are at a low logic level), thereby performing an FW function of the semiconductor memory circuit. (For example, reference may be made to Japanese Patent Laid-open No. 29987/90.)

The structure and operation of an example of a semiconductor memory circuit of the conventional type will be described with reference to FIGS. 1 to 4. FIG. 1 is a block diagram showing the structure of an example of the conventional type, and FIG. 2 is a circuit diagram showing a principal part of the diagram of FIG. 1. In FIG. 1, a row address decoder 308 is connected on one side to a memory cell array 306 through word lines 309 (WL1, WL2, ...), and on the other side to a row address buffer 307. Address data are supplied to the row address buffer 307 through address pins A1 to An. Also, to the bit lines on the column side of the memory cell array 306, there are connected a sense amplifier 310 (SA1, SA2, ... in FIG. 2), a column switch 301 (Q1, Q1', Q2, Q2', ... in FIG. 2), and an FW gate 304 (SW1, SW2, ... in FIG. 2). A column address buffer 313 is connected to a column address decoder 311, which is in turn connected to the column switch 301. Address data are inputted to the column address buffer 313 through the address pins A1 to An.

Further, the column switch 301 is connected through input/output buses 302, 303 to a data latch circuit 314, which is in turn connected to an input/output terminal 317 (hereinafter referred to as an I/O terminal 317). The FW gate 304 is connected to the data latch circuit 314 through a flash write data bus 305 (hereinafter referred to as an FW data bus 305). The FW gate 304, row address buffer 307, row address decoder 308, sense amplifier 310, row address decoder 311, column address buffer 313 and data latch circuit 314 are controlled by various signals that are inputted to a controller 315. These inputted signals include an $\overline{RAS}$ signal, a column address strobe signal (hereinafter referred to as a $\overline{CAS}$ signal), a write enable signal (hereinafter referred to as a $\overline{WE}$ signal), and a flash write enable signal (hereinafter referred to as an FWE signal).

In addition to the input/output buses 302, 303, the conventional semiconductor memory circuit has an FW gate 304 and FW data bus 305, which are exclusively used for flash writing. The input/output buses are usually composed of a pair of buses including bus 302 which carries write (or read) data (hereinafter referred to as I/O bus 302) and bus 303 which carries data of an opposite phase (hereinafter referred to as I/O bus 303). However, the FW data bus 305 can be structured with only one line which carries data of a positive phase (or a negative phase). FIG. 2 shows a principal part of a concrete example of a circuit of the conventional semiconductor memory circuit which employs an FW data bus consisting of only one line.

The following description is made with reference to bit lines D1 and $\overline{D1}$ of FIG. 2. Specifically, a memory cell MC1 is connected to a bit line $\overline{D1}$ and a word line WL1 where the two lines cross, and a memory cell MC2 is similarly connected to a bit line D1 and a word line WL2. The pair of bit lines D1, $\overline{D1}$ are further connected to a sense amplifier SA1. The bit lines $\overline{D1}$ and D1 are also connected to I/O bus 302 and I/O bus 303 through switches $Q_1$, $Q_1'$, respectively, both switches being N-type MOS transistors. Furthermore, bit line D1 is connected to the FW data bus 305 through a flash write switch SW1 (an N-type MOS transistor, hereinafter referred to as FW switch SW1) of the FW gate 304. Switches $Q_1$, $Q_1'$ are controlled by a signal YSW1 outputted from the column address decoder 311, and FW switch SW1 is controlled by FW gate signal 318. In this case, although FW data of a positive phase (high level) are transmitted to the FW data bus 305 and FW switch SW1 is connected to bit line D1, positive FW data may also be low level. Specifically, FW data may also be transmitted at a low level to the FW data bus 305 while connecting the FW switches (SW1, SW2, ...) to the bit lines ($\overline{D1}$, D1, ...).

The operation of the conventional semiconductor memory circuit illustrated in FIG. 1 and FIG. 2 will next be described with reference to the timing charts of FIG. 3 and FIG. 4. When operating in a flash write mode (hereinafter referred to as FW mode), as shown in FIG. 3, an FWE signal is first activated (high level) followed by activation of an $\overline{RAS}$ signal (low level). When the $\overline{RAS}$ signal is activated, a row address corresponding to a word line activated for flash writing is stored in the row address buffer 307 (FIG. 1) and then decoded by the row address decoder 308. As a result of decoding, word line WL1 for example (one of word lines 309 which include word lines WL1, WL2, ...) is turned to high level, and thus the data is stored in memory cell MC1, for example the data "0," is fetched on bit lines D1, $\overline{D1}$. It is to be noted that, by this time, FW data of positive phase has already been transmitted from the data latch circuit 314 to the FW data bus 305 as a result of the activation of the FWE signal.

The controller 315 then activates (high level) an FW gate signal 318 to operate FW switch SW1 for outputting FW data to bit line D1, for example, FW data "0" fetched from the I/O terminal 317 to the data latch circuit 314. With this outputted FW data, bit line D1 is compulsorily driven toward the direction of "0," and when the controller 315 activates a sense amplifier activation signal, a signal SEP for supplying a signal of a +Vcc level and a signal SEN for supplying a signal of a ground level are activated to further activate sense amplifier SA1, thereby causing sense amplifier SA1 to amplify the FW data on the bit line. As a result of this amplification, bit line D1 turns to "0," bit line $\overline{D1}$ turns to "1," and "1" is also stored in memory cell MC1 connected to bit line $\overline{D1}$. In the same way as described above, FW data are also stored in the same cycle in other memory cells connected to word line WL1.

In the case of normal reading, as shown in FIG. 4, a word line with a predetermined row address, e.g., WL1, is activated due to activation of an $\overline{RAS}$ signal to output the data of memory cell MC1, e.g., "1," to the bit line. Subsequently, when sense amplifier SA1 is activated by the sense amplifier activating signals SEP and SEN, and the data of memory cell MC1 are amplified, column switches $Q_1$, $Q_1'$ are turned on for fetching the data of the pair of bit lines $\overline{D1}$, D1 to the I/O buses 302, 303. In the case of writing, in contrast to the above, the data on the I/O buses 302, 303 are transmitted to the pair of bit lines $\overline{D1}$, D1 by turning the column switches $Q_1$, $Q_1'$ on.

To simplify the FW gate activation circuit, as shown in the timing chart of FIG. 3, the conventional semiconductor memory circuit is structured such that FW gate signals are activated or inactivated in synchronization with the activation or inactivation of an $\overline{RAS}$ signal, respectively. The longer the activation period of the $\overline{RAS}$ signal, the longer the activation period of the FW gate signal.

In the conventional semiconductor memory circuit, if a bit line is short-circuited by, for example, a signal SEP line or a word line due to problems in the manufacturing process (for example, if a transistor Tr of sense amplifier SA1 in FIG. 2 is activated while a resistance between P1 and N1 is much lower than standard), the quality of the semiconductor memory circuit will be impaired. However, if the circuit is provided with redundant bit lines and a circuit related therewith which can substitute for the portion relating to the defective bit lines, the quality of the semiconductor memory circuit can be restored by replacing the defective lines with the redundant lines.

However, if the FW switch is connected to the defective bit line, the FW switch becomes active in the FW mode and the FW data are transmitted to the defective bit line through the FW data bus 305. In this case, if the defective bit line has a voltage by which the polarity of data of the defective line becomes the reverse of that of the FW data, for example, if the voltage of the FW data is "0" and the defective bit line is short-circuited by a line having a voltage Vcc or by a word line, an electric current flows from the line having the voltage Vcc or from the word line to the FW data bus, thereby causing the operation current to disadvantageously increase in the FW mode.

SUMMARY OF THE INVENTION

It is an object of the present invention to overcome the above defects and provide, even if the semiconductor memory circuit has the above-described defects caused by problems in the manufacturing process, a flash write method which can limit the increase of the operation current in FW mode to a lower level than can be achieved by the conventional method and also provide a semiconductor memory circuit which employs the flash write method. The above object can be achieved according to the following method and circuit.

To achieve the above-described object, the flash write method for a semiconductor memory circuit of the present invention includes: line, each of a plurality of memory cells, each cell disposed at a crossing area of a word line and a bit line; sense amplifiers, with one sense amplifier amplifying data of each of the pairs of bit lines; a flash write data bus to be supplied with flash write data; flash write gate switches for switching connections with the flash write data bus between the bit lines in the pairs of bit lines; a control means for activating a word line corresponding to a given row address, activating flash write gate switches, activating sense amplifiers, and writing flash write data to all memory cells connected to an activated word line simultaneously; and wherein the method is characterized by controlling the length of a time period during which the flash write gate switches are activated by the control means such that the flash write gate switches are activated only during a time period in which the word line is activated.

In the above-described method of flash writing, the time period during which the flash write gate switch is activated is controlled so as to be more than enough time for writing flash write data to the bit line but is also controlled so as to be as short as possible.

To achieve the above-described object, a semiconductor memory circuit of the present invention includes memory cells; word lines; a plurality of pairs of bit lines, each of the memory cells being disposed at a crossing area of one of the word lines and one of the bit lines; sense amplifiers, one sense amplifier amplifying data of each of the pairs of bit lines; a flash write data bus to be supplied with flash write data; flash write gate switches for switching connection with the flash write data bus between the bit lines of the pairs of bit lines; a control means for activating a word line corresponding to a given row address, activating the flash write gate switches, activating the sense amplifiers and writing flash write data to memory cells connected to an activated word line; and a timing control circuit for controlling the length of a time period during which the flash write gate switches are activated by the control means such that the flash write gate switches are activated only during a time period in which the word line is activated.

In the semiconductor memory circuit of the present invention, the timing control circuit may also include an activation detecting circuit for detecting that an inputted row address strobe signal and flash write enable signal are active; and an activation time adjusting circuit for activating the flash write gate switch for a predetermined time period when the activation detecting circuit detects that the inputted signals are active.

In the semiconductor memory circuit according to the present invention, the length of the time period in which the flash write gate switch is activated by the timing control circuit may also be controlled so as to be more than the length of time necessary for writing flash write data to the bit line but at the same time be controlled so that it is as short as possible.

In the semiconductor memory circuit according to the present invention, the length of a time period during which the flash write gate switch is activated by the activation time adjusting circuit may also be controlled so as to be more than the length of time necessary for writing flash write data to the bit line but at the same time be controlled so that it is as short as possible.

In the semiconductor memory circuit according to the present invention, a plurality of the memory cells may be disposed in the form of an array.

Since the timing control circuit controls the flash write gate switch such that the switch is activated only within the time period in which the word line is activated and, in addition, the activation time period is controlled in a preferred embodiment so that it is to be as short as possible, even if an electric current flows between the bit line and flash write data bus due to problems such as wiring defects occurring during manufacturing, the current will continue to flow only for a minimum time period.

The above and other objects, features, and advantages of the present invention will become apparent from the following description referring to the accompanying drawings which illustrate an example of a preferred embodiment of the present invention.

DETAILED DESCRIPTION OF THE PREFERRED EMBODIMENTS

Figure 5:
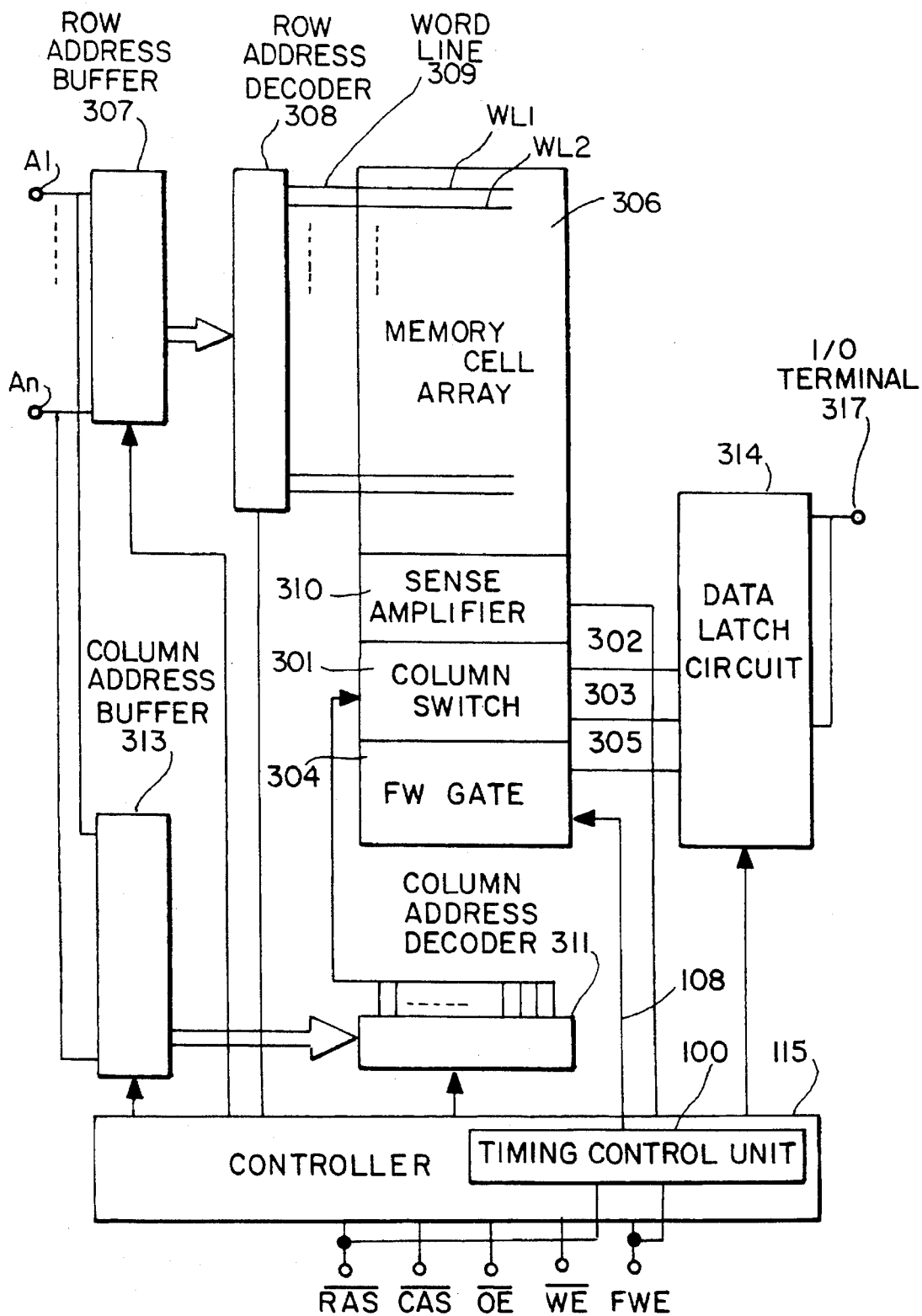
FIG. 5 is a block diagram showing an embodiment of a semiconductor memory circuit of the present invention.

The present invention will next be described with reference to the FIGS. 5 and 6.

The semiconductor memory circuit of the present embodiment is prepared by improving the conventional semiconductor memory circuit shown in FIGS. 1–4. The controller 115 of the present embodiment is constructed by additionally providing in the conventional controller 315 a timing control unit 100 for the flash write gate signal.

Figure 1:
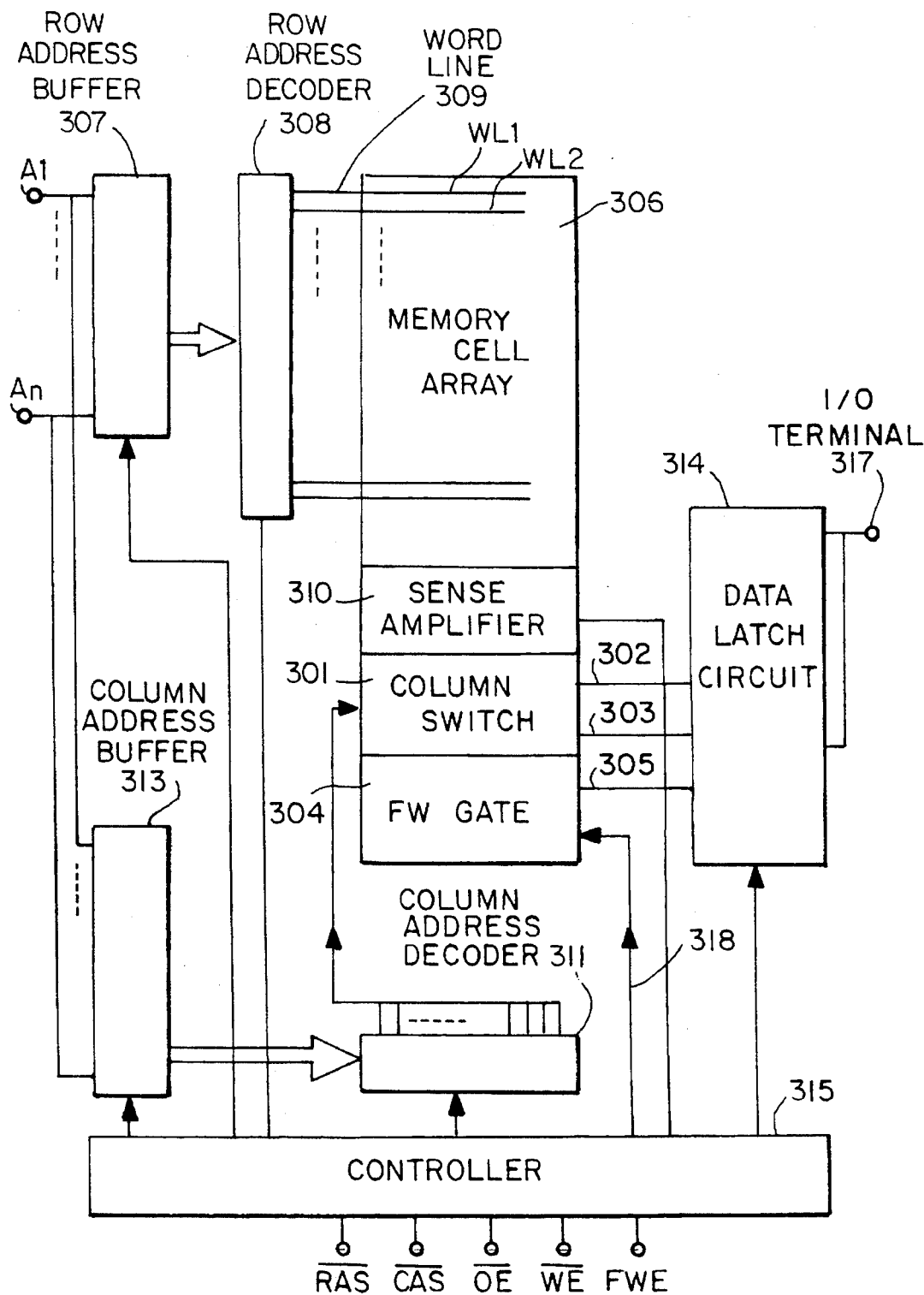
FIG. 1 is a block diagram of a semiconductor memory circuit of a conventional type.
Figure 2:
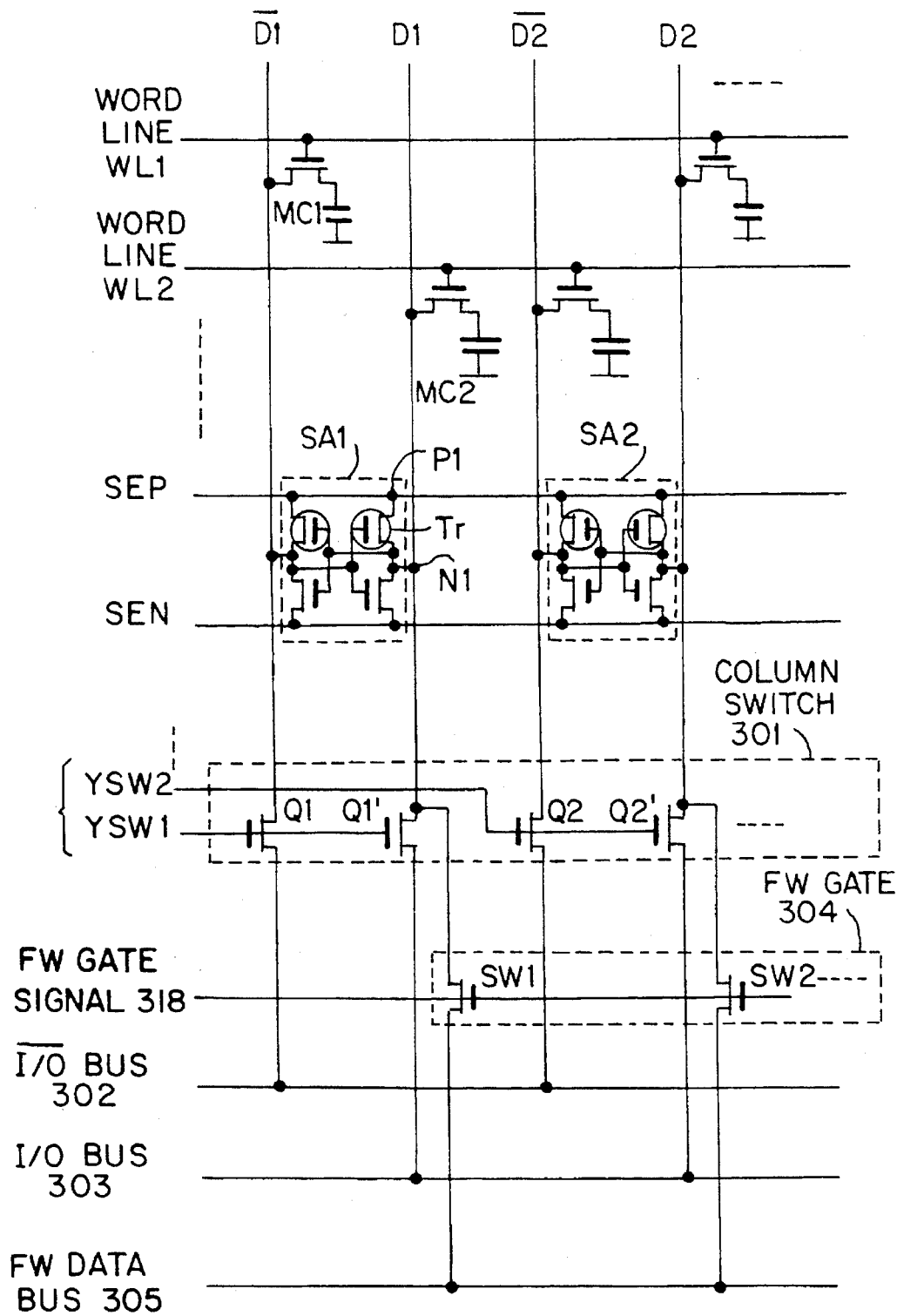
FIG. 2 is a circuit diagram showing a principal part of the conventional example of FIG. 1.
Figure 3:
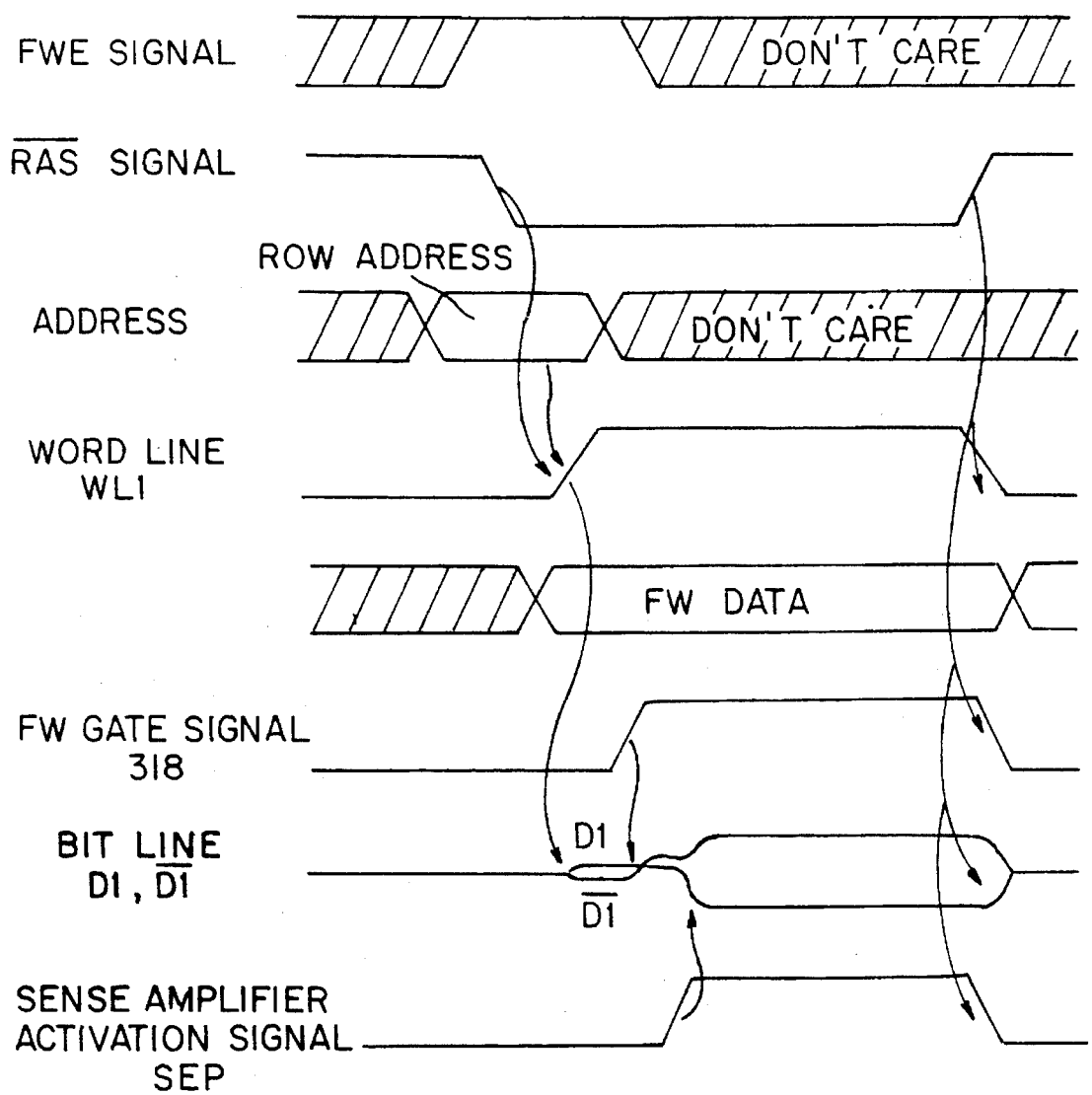
FIG. 3 is a timing chart showing the operation of the conventional example of FIG. 1 operating in FW mode.
Figure 4:
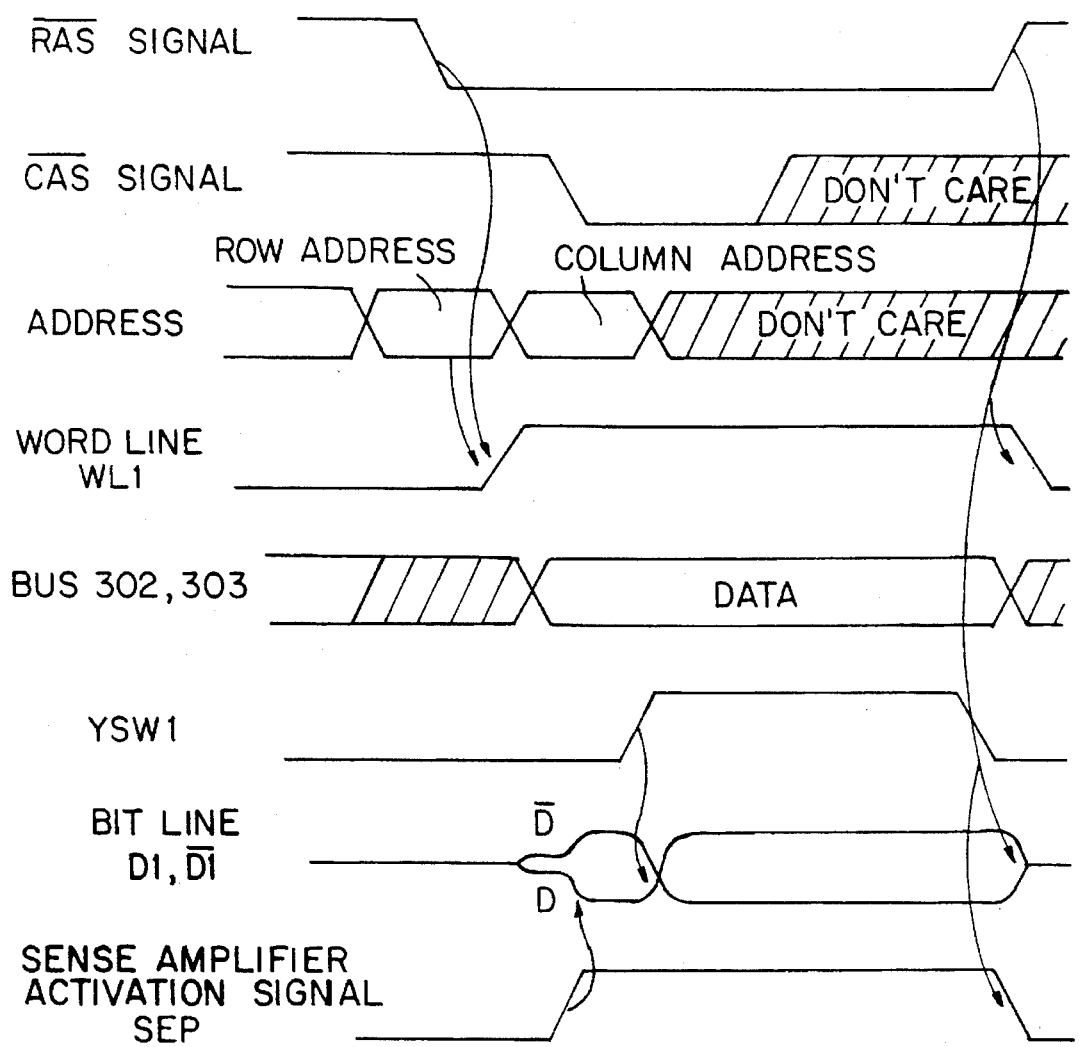
FIG. 4 is a timing chart showing the normal read/write operation of the conventional example of FIG. 1.
Figure 6:
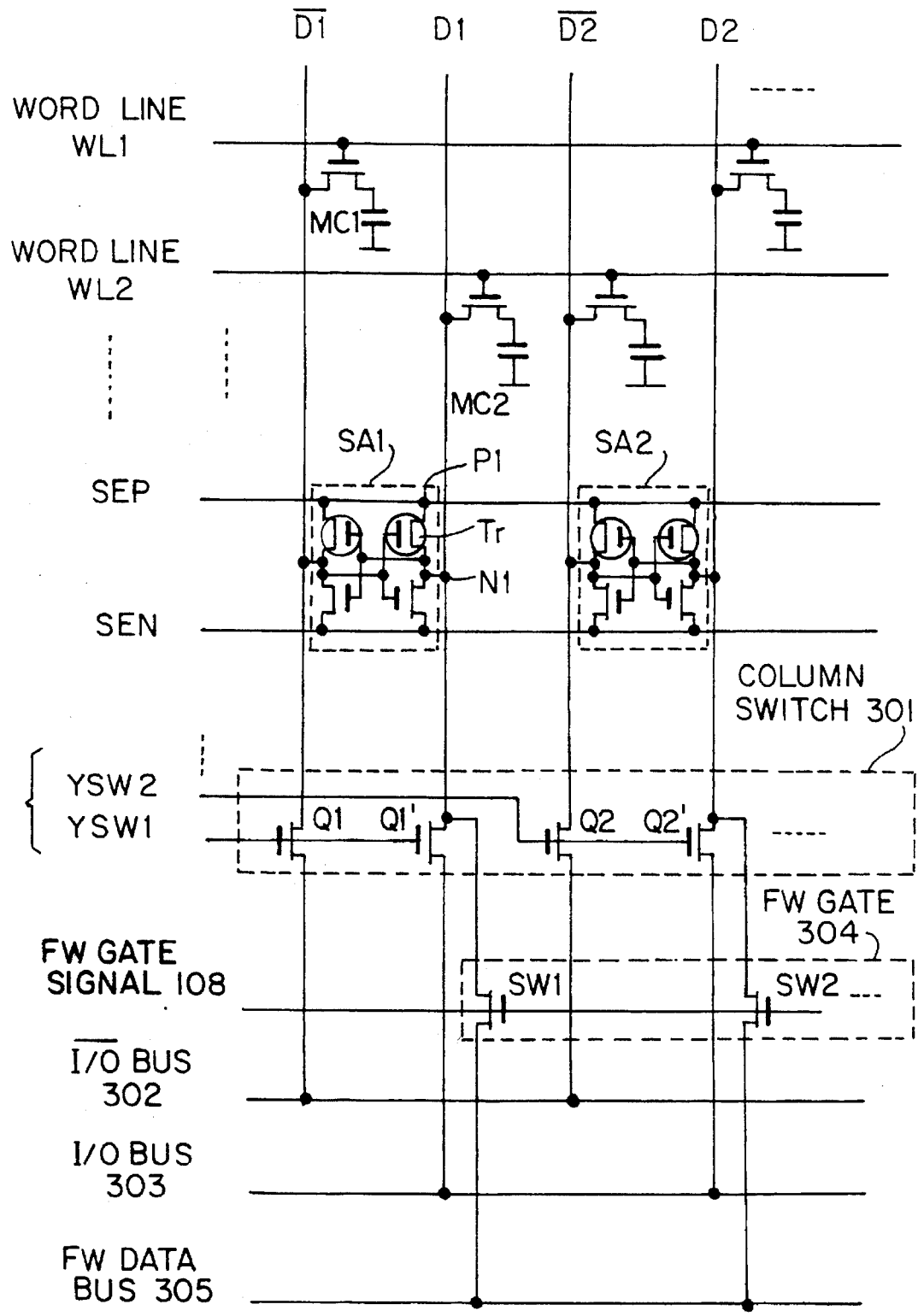
FIG. 6 is a circuit diagram showing a principal part of the embodiment of FIG. 5.

The principal part shown in FIG. 6 is the same as that shown in FIG. 2 with the exception of an FW gate signal 108 which is applied to the FW gate.

Figure 7:
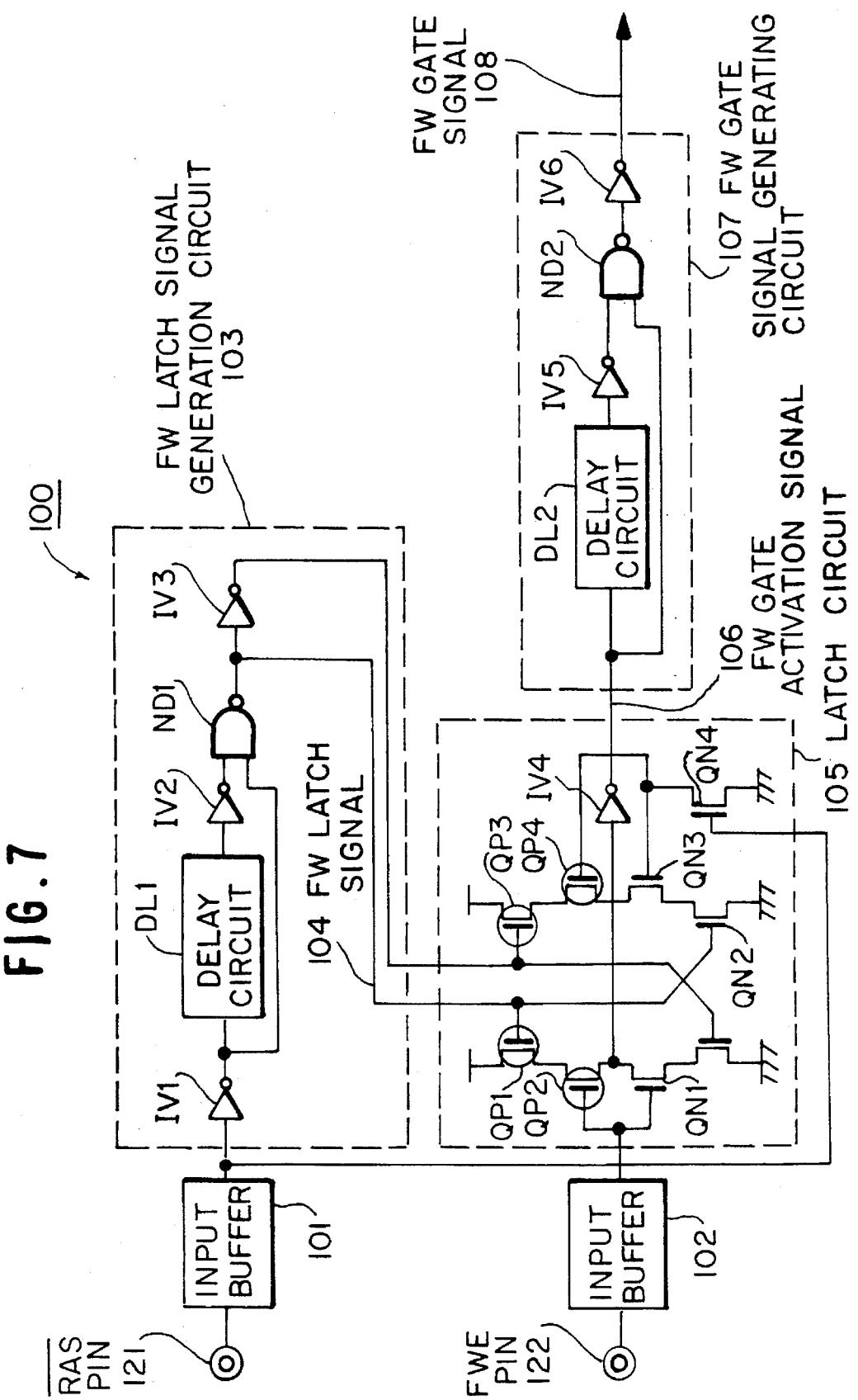
FIG. 7 is a circuit diagram showing a flash gate signal timing control unit of the controller of FIG. 5.

A flash write gate signal timing control unit 100 (FW gate signal timing control unit 100, hereinafter flash write is referred to as FW) is composed of, as shown in FIG. 7, input buffers 101, 102 for receiving signals to be supplied from an RAS pin 121 and an FWE pin 122, respectively, an FW latch signal generation circuit 103, a latch circuit 105 and an FW gate signal generating circuit 107.

Figure 8:
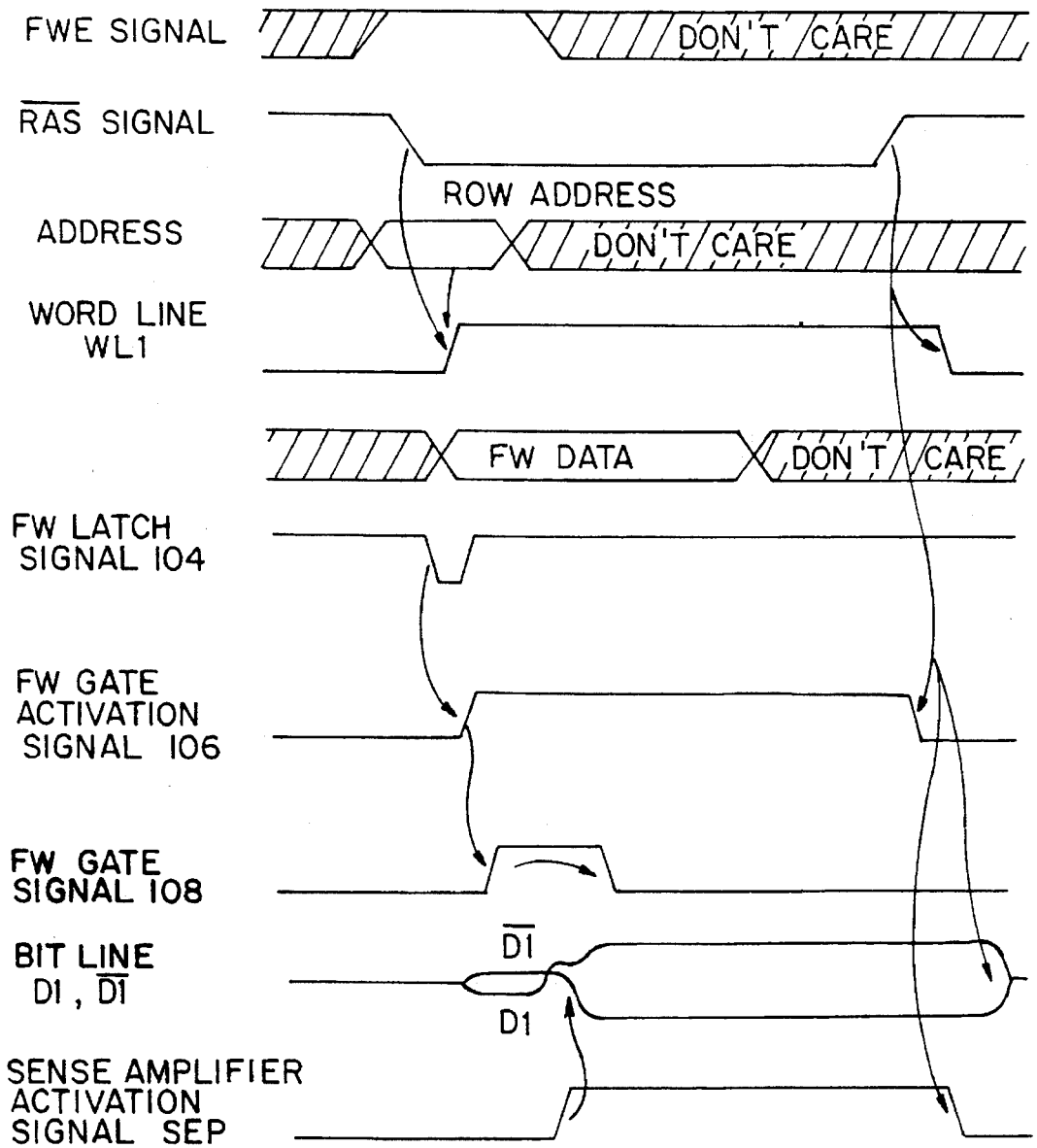
FIG. 8 is a timing chart illustrating the operation of the embodiment shown in FIG. 5 to FIG. 7.

The FW latch signal generation circuit 103 comprises an inverter IV1 for receiving an output of the input buffer 101, an inverter IV2 for receiving an output of the inverter IV1 through a delay circuit DL1, a NAND circuit ND1 for performing a NAND operation with reference to outputs of the inverters IV1, IV2, and an inverter IV3 for receiving an output of the NAND circuit ND1. The circuit 103 generates an FW latch signal from an $\overline{RAS}$ signal (FIG. 8).

The latch circuit 105 comprises P-type transistors QP1 to QP4, N-type transistors QN1 to QN4, and an inverter IV4, and latches an output signal of the input buffer 102 based on the FW latch signal from the FW latch signal generation circuit 103 to output the signal as an FW gate activation signal 106.

The FW gate signal generation circuit 107 comprises an inverter IV5 for receiving the FW gate activation signal 106 through a delay circuit DL2, a NAND circuit ND2 for performing a NAND operation with reference to the FW gate activation signal 106 and an output of the inverter IV5, and an inverter IV6 which receives an output of the NAND circuit ND2 and outputs the FW gate signal 108. As can be seen in FIG. 8, the period of the signal 108 is limited depending on the delay time of the delay circuit.)

An FWE signal buffered by input buffer 102 is latched in the latch circuit 105 according to the FW latch signal 104 generated as a one-shot signal in the FW latch signal generation circuit 103. Here, if the FWE pin is at a high level when an $\overline{RAS}$ signal is at a low level, the FW gate activation signal 106 outputted from the latch circuit 105 is activated and the FW gate signal 108 is also activated by the FW gate signal generation circuit 107.

These operations will be further described with reference to the timing chart shown in FIG. 8. When the FW gate activation signal 106 is activated by the FW latch signal 104 after the $\overline{RAS}$ signal is lowered to a low level, the FW gate is activated. At this time, the FW gate activation period is defined by a delay circuit in the FW gate signal generation circuit 107, and it is acceptable if the activation period is longer than the time required for writing FW data to bit lines. After the FW data from the FW data bus are transmitted to bit lines, the electric potential difference between bit lines is amplified by the sense amplifier activation signal. Therefore, the FW gate can be inactivated while the $\overline{RAS}$ signal is activated (low level).

As described above, the present invention has a circuit which is structured such that the FW gate is inactivated while the $\overline{RAS}$ signal is activated (in a low level). Therefore, when a defective bit line is of a logic level which is opposite that of the FW data, for example, when the FW data is "0" and the defective bit line is short-circuited by a line having a voltage Vcc or by a word line, it is possible to reduce the electric current which flows from the line having the voltage Vcc or from the word line to the FW data bus, thereby reducing the operation current in an FW mode.

As a specific example, in FIG. 6, even when transistors of sense amplifier SA1 are activated and P1 and N1 are connected through a small resistance, since the period of the FW gate signal 108 is limited so as to be as short as possible, as shown in FIG. 8, the operation current in the FW mode can also be reduced.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method of flash writing for a semiconductor memory circuit, wherein said memory circuit includes:

a plurality of memory cells, with each cell being disposed at a crossing area of one of a plurality of word lines and one of a plurality of bit lines;

a plurality of sense amplifiers arranged such that one sense amplifier amplifies data of each of said pairs of bit lines;

a flash write data bus to be supplied with flash write data; and a plurality of flash write gate switches for switching connections with said flash write data bus between the bit lines in said pairs of bit lines;

said method comprising the steps of:

activating a word line corresponding to a given row address, activating said plurality of flash write gate switches, activating said plurality of sense amplifiers, and writing said flash write data to all memory cells connected to said activated word line simultaneously; and controlling the length of a time period during which said flash write gate switches are activated by said control means such that said flash write gate switches are activated only during a time period in which said word line is activated.

2. The method of flash writing according to claim 1 wherein:

the length of said time period during which said flash write gate switches are activated is controlled so as to be as short in duration as possible while still long enough in duration to allow for writing flash write data to said bit line.

3. A semiconductor memory circuit comprising:

a plurality of memory cells, with each cell being disposed at a crossing area of one of a plurality of word lines and one of a plurality of bit lines;

a plurality of sense amplifiers arranged such that one sense amplifier amplifies data of each of said pairs of bit lines;

a flash write data bus that is supplied with flash write data;

a plurality of flash write gate switches for switching connection with said flash write data bus between the bit lines of said pairs of bit lines;

a control means for activating a word line corresponding to a given row address, activating said flash write gate switches, activating said sense amplifiers and writing flash write data to memory cells connected to an activated word line; and a timing control circuit for controlling the length of a time period during which said flash write gate switches are activated by said control means such that said flash write gate switches are activated only during a time period in which said word line is activated.

4. The semiconductor memory circuit according to claim 3 wherein said timing control circuit further comprises:

an activation detecting circuit for detecting that an inputted row address strobe signal and flash write enable signal are active; and an activation time adjusting circuit for activating said flash write gate switch for a predetermined time period when said activation detecting circuit detects that said inputted signals are active.

5. The semiconductor memory circuit according to claim 4 wherein the length of said time period in which said flash write gate switch is activated by said timing control circuit is controlled so as to be as short in duration as possible while still long enough in duration to allow for writing flash write data to said bit lines.

6. The semiconductor memory circuit according to claim 3 wherein the length of said time period in which said flash write gate switch is activated by said timing control circuit is controlled so as to be as short in duration as possible while still long enough in duration to allow for writing flash write data to said bit lines.

7. The semiconductor memory circuit according to claim 3 wherein a plurality of said memory cells are disposed in the form of an array.

* * * * *